US011435384B2

(12) United States Patent
Wen et al.

(10) Patent No.: US 11,435,384 B2
(45) Date of Patent: Sep. 6, 2022

(54) METHOD AND DEVICE FOR ESTIMATING SPATIAL DISTRIBUTION OF INERTIA OF POWER SYSTEM BASED ON MULTI-INNOVATION IDENTIFICATION

(71) Applicant: Hunan University, Changsha (CN)

(72) Inventors: Yunfeng Wen, Changsha (CN); Yuanchen Li, Changsha (CN); Xiaohuang Lin, Changsha (CN); Li Kuang, Changsha (CN)

(73) Assignee: Hunan University, Changsha (CN)

( * ) Notice: Subject to any disclaimer, the term of this patent is extended or adjusted under 35 U.S.C. 154(b) by 0 days.

(21) Appl. No.: 17/544,338

(22) Filed: Dec. 7, 2021

(65) Prior Publication Data
US 2022/0196713 A1 Jun. 23, 2022

(30) Foreign Application Priority Data

Dec. 22, 2020 (CN) .......................... 202011525723.5

(51) Int. Cl.
*G01R 21/133* (2006.01)
*H02J 3/00* (2006.01)

(52) U.S. Cl.
CPC .............. *G01R 21/133* (2013.01); *H02J 3/00* (2013.01); *H02J 2203/20* (2020.01)

(58) Field of Classification Search
CPC ........ G01R 21/133; H02J 3/00; H02J 2203/20
See application file for complete search history.

(56) References Cited

U.S. PATENT DOCUMENTS

| 2019/0285671 A1* | 9/2019 | Ventola | G01R 21/133 |
| 2019/0369147 A1* | 12/2019 | Liu | G01R 23/06 |
| 2020/0099315 A1* | 3/2020 | Lee | H02M 7/53871 |
| 2021/0210957 A1* | 7/2021 | Du | H02J 3/12 |

FOREIGN PATENT DOCUMENTS

| CN | 109995023 A | 7/2019 |
| CN | 110943451 B | 5/2021 |

OTHER PUBLICATIONS

Wang et al., Estimating inertia distribution to enhance power system dynamics, North American Power Symposium, Sep. 2017 (Year: 2017).*

* cited by examiner

*Primary Examiner* — Toan M Le
*Assistant Examiner* — Xiuqin Sun

(57) ABSTRACT

A method and device for estimating spatial distribution of power system inertia based on multi-innovation identification. The method includes: (S1) acquiring time-series data including each node frequency of a power system and a transmission power of a transmission line; decomposing a frequency signal in a series of different spaces to identify a disturbance occurring moment; (S2) analyzing a relationship among node inertia, node frequency and node injection power; constructing an OEMA model to describe an active power-frequency dynamic process of the node after the disturbance occurs; analyzing a coupling relationship between an unknown parameter of the model and the node inertia; (S3) solving the OEMA model based on multi-innovation identification to identity the unknown parameter; and (S4) according to the relationship between a vector of the parameter and the node inertia, calculating each node inertia to estimate the spatial distribution of the power system inertia.

5 Claims, 4 Drawing Sheets
(2 of 4 Drawing Sheet(s) Filed in Color)

METHOD AND DEVICE FOR ESTIMATING SPATIAL DISTRIBUTION OF INERTIA OF POWER SYSTEM BASED ON MULTI-INNOVATION IDENTIFICATION

CROSS-REFERENCE TO RELATED APPLICATIONS

This application claims the benefit of priority from Chinese Patent Application No. 202011525723.5, filed on Dec. 22, 2020. The content of the aforementioned application, including any intervening amendments thereto, is incorporated herein by reference in its entirety.

TECHNICAL FIELD

The present application relates to dispatching operation of a power system, and more particularly to a method and device for estimating spatial distribution of inertia of a power system based on multi-innovation identification.

BACKGROUND

With the development of new energy sources and the construction of high-capacity direct current (DC) transmission projects, the synchronous generator unit in the power grid is gradually replaced with the nonsynchronous power supply. Since the direct current and new energy are connected to the grid through a power electronic converter, their transmission powers are decoupled from the grid frequency, so that they are free of inertia response characteristics. With the integration of a large number of non-synchronous power supplies such as DC and renewable energies, the overall inertia level of the system will be greatly attenuated, which will accelerate the frequency change after encountering a disturbance and deteriorate the frequency stability of the system. Additionally, the distribution difference of the new energy resources breaks the original relatively balanced distribution pattern of the inertia resources. The centralized grid-connected region of the renewable energy exhibits an obvious low-inertia characteristic, which is in a sharp contrast with the high-inertia state of the grid-connected region of the synchronous generator unit cluster. Additionally, the access of the high-capacity DC transmission line blocks the inertia support between the grids in different regions to some extent, so that the uneven spatial distribution of the system inertia is aggravated. The replacement of the local synchronous power supply with the DC feed-in power further aggravates the imbalance of the inertia distribution of the local grid.

With the access of the non-synchronous power supplies, such as high-capacity DC and renewable energy to the grid, the power system exhibits a remarkable inertia spatial distribution characteristic. Under the active power disturbance, the non-synchronous power supply centralized region with weak inertia is prone to frequency instability due to the rapider frequency variation with respect to the high-inertia regions, which will severely limit the overall loading capability of the system. Thus, the estimation of the power system inertia should not only focus on the overall level, but also consider the spatial distribution situation, such that the adaptability of the access of the local new energy/direct current and the security and stability of the system during the operation can be improved.

At present, the estimation of the power system inertia is merely carried out at the levels of system and region.

1. Estimation of power system inertia based on equivalent inertia

The overall inertia level in the power system is estimated by reading the on/off status of the units in the supervisory control and data acquisition (SCADA) system. Specifically, the inertia time constants of all online units are respectively multiplied by their capacities, and the products are added to obtain the total rotational kinetic energy of the system to determine the overall inertia of the system.

2. Estimation of power system inertia based on polynomial fitting

The regional power grid is simplified as an equivalent synchronous unit to establish an equivalent frequency response model of the regional power grid. A frequency simulation curve is obtained by simulating the disturbance fault, and then the polynomial fitting is employed to further extract the initial rate-of-change of frequency (RoCoF) of the system after the occurrence of the disturbance. Finally, the overall inertia level of the regional power grid is obtained based on the initial RoCoF and the capacity of the disturbance fault.

3. Estimation of power system inertia based on system identification

The method commonly performs equivalent simplification on the regional power grid, and the frequency deviation, the increment of the load power, the power increment of the section tie line, and the increment of the mechanical power of the regional power grid are taken as the input. An identification model for describing the active power-frequency response of the regional power grid is constructed to obtain the inertia of the regional power grid.

From the above analysis, the existing methods for estimating power system inertia mainly focus on the inertia level at the system and region levels, and have limited estimation precision, failing to reflect the specific spatial distribution of the power system inertia, and also failing to provide effective reference information for the operators to identify the low-inertia region.

SUMMARY

An object of this application is to provide a method and device for estimating spatial distribution of inertia of a power system based on multi-innovation identification to solve the technical problem that the existing methods for estimating power system inertia mainly focus on the overall inertia level at the system and region levels, and have limited estimation precision, failing to reflect the specific spatial distribution of the power system inertia and also failing to provide effective reference information to identify the low-inertia region during the operational dispatch of the power system. The device and method provided herein can assist the operators to accurately locate the weak-inertia regions of the power system, and arrive at the deep analysis of the specific distribution of system inertia.

Technical solutions of this application are described as follows.

In a first aspect, this application provides a method for estimating spatial distribution of inertia of a power system, comprising:

(S1) acquiring a time-series data, wherein the time-series data comprises a frequency of each node of the power system and a transmission power of a transmission line, and preprocessing the time-series data; decomposing a frequency signal in a series of different spaces to accurately identify a moment when a disturbance occurs and trace an impact of the disturbance fast;

(S2) analyzing a relationship among a node inertia, a node frequency and a node injection power; constructing an output error moving average (OEMA) model to describe an active power-frequency dynamic process of each node after the disturbance; and analyzing a coupling relationship between an unknown parameter in the OEMA model and the node inertia;

(S3) solving the OEMA model by adopting a multi-innovation identification, and identifying the unknown parameter of the OEMA model; and (S4) calculating an inertia of each node by using the unknown parameter of the OEMA model identified in step (S3) according to an analytical relationship between a vector of the unknown parameter and the node inertia to estimate an overall spatial distribution of the inertia of the power system.

The working principle of the disclosure is illustrated as follows.

The existing methods for estimating power system inertia mainly focus on the overall inertia level at the system and region levels, and have limited estimation precision, failing to reflect the specific spatial distribution of the power system inertia, and also failing to provide effective reference information to identify weak-inertia region during the dispatching operation process of the power system.

Thus, the disclosure designs a method for estimating spatial distribution of power system inertia based on multi-innovation identification, which includes: data preprocessing and accurate identification of disturbance moments in a research scene; analysis of the relationship among the node inertia, node frequency and node injection power and establishment of the OEMA model for estimating the node inertia; solving of the unknown parameter in the model based on the multi-innovation identification; establishment of a mathematical relationship between the unknown parameter and the node inertia; and calculation of an inertia of each node to further estimate the spatial distribution of the overall power system inertia.

The data preprocessing and accurate identification of disturbance moments in the research scene, the rapid tracing of the disturbance, and the extraction and preprocessing of the data at the inertia response stage constitute the data foundation for the estimation of the node inertia. The analysis of the relationship among the node inertia, node frequency, and node injection power and the establishment of the OEMA model contribute to converting the estimation of the node inertia into the identification of the parameters in the model by describing the dynamic change of the node frequency and the node injection power. By means of the multi-innovation identification, the unknown parameter in the output error moving average (OEMA) model can be quickly solved. The mathematical relationship between the unknown parameter and the node inertia is established to calculate the inertia of each node by deduction, thereby estimating the spatial distribution of the overall power system inertia. In this application, the estimation of the spatial distribution of the inertia is refined to the node level, which can provide the more effective reference information for the dispatching personnel to accurately locate the weak-inertia regions, so as to strengthen the operation safety and stability of the system and improve its loading capacity.

In an embodiment, the step (S1) comprises:

(S11) acquiring the time-series data for estimating the spatial distribution of the inertia of the power system in real time using a synchronized phasor measurement unit (PMU), wherein the time-series data comprises the frequency of each node, the transmission power of the transmission line, a node load and an electromagnetic power of a generator;

(S12) preprocessing the time-series data obtained in step (S11), wherein the preprocessing of the time-series data comprises: interpolation of a missing data and elimination of a data measurement noise adopting a filtering method;

(S13) normalizing the time-series data preprocessed in step (S12) to form a dataset in a standard form for analyzing the node inertia, thereby estimating the spatial distribution of the inertia of the power system;

(S14) decomposing the frequency signal in the series of different spaces based on wavelet multi-resolution analysis using a Daubechies Wavelet; and extracting a wavelet detail coefficient at each level to determine a modulus maxima spot, thereby detecting a singular point of the frequency signal, wherein the identified singular point of the frequency signal is an initial time when the disturbance occurs.

In an embodiment, the step (S2) comprises:

(S21) in terms of a mechanism of a frequency response of the power system, analyzing a coupling relationship among the node inertia, the node frequency and the node injection power;

(S22) using Laplace transform to convert a time domain relationship among the node inertia, the node frequency and the node injection power into a continuous frequency domain expression, wherein the continuous frequency domain expression is a continuous transfer function comprising an information of the node inertia; and (S23) constructing the OEMA model to describe the active power-frequency dynamic change process of each node; converting solving of the node inertia into identification of the unknown parameter of the OEMA model; and analyzing the coupling relationship between the unknown parameter of the OEMA model and the node inertia; wherein an expression of the OEMA model is shown as follows:

$$y(t) = \frac{B(z)}{A(z)}u(t) + D(z)v(t)$$

$$x(t) = \frac{B(z)}{A(z)}u(t);$$

$A(z)=1+a_1z^{-1}+ \ldots +a_{n_a}z^{-n_a}$; $B(z)=b_1z^{-1}+ \ldots +b_{n_b}z^{-n_b}$; $D(z)=1+d_1z^{-1}+ \ldots +d_{n_d}z^{-n_d}$; $y(t)$ is an output sequence of the OEMA model to be identified; $u(t)$ is an input sequence of the OEMA model to be identified; $v(t)$ is a zero-mean Gaussian random white noise sequence; $x(t)$ is an internal variable, which represents an actual undetectable variable of the power system, $z^{-1}$ is a unit backshift operator, expressed as $z^{-1}y(t)=y(t-1)$; and $a_{n_a}$, $b_{n_b}$, $d_{n_d}$ represents parameters to be identified of the OEMA model;

In an embodiment, in step (S21), the coupling relationship among the node inertia, the node frequency and the node injection power is expressed as follows:

$$2H_i\frac{d\Delta f_i(t)}{dt} = \Delta P_i(t);$$

which is further converted into:

$$H_i = \frac{\Delta P_i(t)}{2\frac{d\Delta f_i(t)}{dt}};$$

wherein $H_i$ is an inertia value of node i, and represents a magnitude of a hindering effect of the inertia of the power system on a frequency change of the node i during a $\Delta P_i$–d$\Delta f_i$/dt process; $\Delta f_i$ is a node frequency deviation; and $\Delta P_i$ is an increment of the node injection power;

in step (S22), the continuous transfer function corresponding to the relationship among the node inertia, the node frequency and the node injection power is expressed as follows:

$$G(s) = \frac{\Delta f_i(s)}{\Delta P_i(s)} = \frac{1}{2H_i s};$$

wherein $\Delta f_i(s)$ is a frequency domain expression of the node frequency deviation; $\Delta P_i(s)$ is a frequency domain expression of the increment of the node injection power; and s is a Laplace operator.

Thus, a pole-zero gain value of a model of the continuous transfer function is an initial impulse response value, which equals to a reciprocal of twice the node inertia.

In an embodiment, the step (S3) comprises:

(S31) expanding a single innovation describing the active power-frequency dynamic change process of each node into multiple innovations to establish a multi-innovation matrix to strengthen an identification precision of the unknown parameter in the OEMA model established in step (S23), wherein the multi-innovation matrix is expressed as follows:

$$\begin{bmatrix} X(p,t) \\ Y(p,t) \\ V(p,t) \\ \psi(p,t) \end{bmatrix} = \begin{bmatrix} x(t), x(t-1), \ldots, x(t-p+1) \\ y(t), y(t-1), \ldots, y(t-p+1) \\ v(t), v(t-1), \ldots, v(t-p+1) \\ \varphi(t), \varphi(t-1), \ldots, \varphi(t-p+1) \end{bmatrix};$$

wherein 1(t) is an information vector comprising the internal variable x(t) and $\varphi(t)=[-x(t-1), \ldots, -x(t-n_a), u(t-1), \ldots, u(t-n_b), v(t-1), \ldots, v(t-n_d)]^T$; X(p,t) is an accumulated internal variable; Y(p,t) is a first accumulated output vector; V(p,t) is an accumulated noise variable; $\psi$(p,t) is a first accumulated information matrix; and p is the number of an innovation vector;

(S32) replacing an internal undetectable variable of the OEMA model with an output of an auxiliary model based on an auxiliary model identification idea using an actual measured information to further eliminate an impact of noise contained in an input data of the OEMA model; wherein the auxiliary model is expressed as follows:

$$\hat{x}(t) = \varphi_S^T(t)\theta_S;$$

wherein,
$\varphi_S(t)=[-x(t-1), \ldots, -x(t-n_a), u(t-1), \ldots, u(t-n_b)]^T$, $\theta_S=[a_1, a_2, \ldots, a_{n_a}, b_1, b_2, \ldots, b_{n_b}]$ is a vector of the parameter to be identified $a_{n_a}$, $b_{n_b}$; and (S33) based on step (S32), setting a criterion function; obtaining an optimal identification result of a parameter of the OEMA model on a basis of a least squares estimation principle on the premise of allowing the criterion function to be minimum to obtain a value of all unknown parameters of the OEMA model, wherein the criterion function is expressed as follows:

$$J(\theta) := \sum_{i=1}^{t} \|Y(p,i) - \psi^T(p,i)\theta\|^2;$$

wherein, Y(p,i) is a second accumulated output vector; $\psi$(p,i) is a second accumulated information matrix; $\varphi=[a_1, a_2, \ldots, a_{n_a}, b_1, b_2, \ldots, b_{n_b}, d_1, d_2, \ldots d_{nd}]$ represents a vector of the parameter to be identified $a_{n_a}$, $b_{n_b}$, $d_{n_d}$; p is the number of the innovation vector.

In an embodiment, the step (S4) comprises:

(S41) considering what the OEMA model describes is a dynamic behavior of a discrete system, establishing a mapping relationship between a z-plane and an s-plane based on bilinear transformation (Tustin transform); and according to the vector of the parameter of the OEMA model identified in step (S3), obtaining an undetermined parameter of a continuous transfer function corresponding to the OEMA model;

(S42) performing an inverse Laplace transformation on the transfer function obtained in step (S41) to obtain an impulse response of a corresponding control system; and taking an initial response value to obtain the reciprocal of twice the node inertia, thereby estimating a size of the node inertia; and (S43) after solving an inertia value of each node of a power grid, estimating the spatial distribution of the inertia of the power system; and visually displaying the spatial distribution of the inertia of the power system by combining a geographic information of each node.

In an embodiment, in step (S41), the bilinear transformation is configured to realize a mapping from the z-plane to the s-plane, and is expressed as follows:

$$z = \frac{e^{sT/2}}{e^{-sT/2}} \approx \frac{1+sT/2}{1-sT/2};$$

wherein, z is a sampling Laplace operator; s is the Laplace operator; and T is a sampling period.

In an embodiment, a discrete transfer function described by the OEMA model is expressed as follows:

$$G'(z) = \frac{B(z)}{A(z)};$$

the discrete transfer function is converted into the continuous transfer function, expressed as follows:

$$G'(s) = \frac{b'_{n-1}s^{n-1} + \ldots + b'_1 s^1 + b'_0}{a'_n s^n + \ldots + a'_1 s^1 + a'_0};$$

wherein, $b_{n-1}'$, ..., $b_0'$, $a_n'$, ..., $a_0'$ are coefficients of a model of the continuous transfer function; and s is the Laplace operator.

In an embodiment, the frequency signal is decomposed and reconstructed under the Daubechies Wavelet basis to detect the singular point of the frequency signal to identify an initial moment of a response of the inertia of the power system, wherein an expression of the wavelet multi-resolution analysis is shown as follows:

$$W_f(a,b) = \langle f, \psi_{a,b} \rangle = |a|^{-1/2} \int_{-\infty}^{+\infty} f(t) \psi\left(\frac{t-b}{a}\right) dt;$$

wherein, $\psi_{a,b}(t)$ is a mother wavelet function, which is the Daubechies Wavelet basis; a is a scale coefficient; b is a translating coefficient; and f(t) is an acquired frequency signal.

In a second aspect, this application also provides a device for implementing the above method, comprising:
an acquiring unit;
a first calculating unit;
a second calculating unit; and
an analyzing unit;
wherein the acquiring unit is configured to acquire a time-series data and preprocess the time-series data, wherein the time-series data comprises a frequency of each node of a power system and a transmission power of a transmission line; the acquiring unit is also configured to decompose a frequency signal in a series of different spaces to identify a moment when a disturbance occurs, and fast trace an impact of the disturbance;

the first calculating unit is configured to analyze a relationship among a node inertia, a node frequency and a node injection power, construct an output error moving average (OEMA) model to describe an active-power-frequency dynamic process of each node after the disturbance, and analyze a coupling relationship between an unknown parameter of the OEMA model and the node inertia;

the second calculating unit is configured to solve the OEMA model in the first calculating unit by adopting a multi-innovation identification to identify the unknown parameter of the OEMA model; and the analyzing unit is configured to calculate an inertia of each node using the unknown parameter of the OEMA model identified by the second calculating unit according to an analytical relationship between a vector of the unknown parameter and the node inertia to estimate an overall spatial distribution of the inertia of the power system.

In an embodiment, the acquiring unit is operated through the following steps:
acquiring the time-series data for estimating the spatial distribution of the inertia of the power system in real time using a synchronized phasor measurement unit (PMU), wherein the data comprises the frequency of each node, the transmission power of the transmission line, a node load and an electromagnetic power of a generator;
preprocessing the acquired time-series data, wherein the preprocessing of the acquired time-series data comprises:
interpolation of a missing data and elimination of a data measurement noise by using a filtering method;
normalizing the preprocessed time-series data to generate a dataset in a standard form for analyzing the node inertia, thereby estimating the spatial distribution of the inertia of the power system; and
decomposing the frequency signal in the series of different spaces based on wavelet multi-resolution analysis using a Daubechies Wavelet; and extracting a wavelet detail coefficient at each level to determine a modulus maxima spot, thereby detecting a singular point of the frequency signal, wherein the identified singular point of the frequency signal is an initial time when the disturbance occurs.

In an embodiment, the first calculating unit is operated through steps of:
in terms of a mechanism of a frequency response of the power system, analyzing a coupling relationship among the node inertia, the node frequency and the node injection power; wherein the coupling relationship among the node inertia, the node frequency and the node injection power is expressed as follows:

$$2H_i \frac{d\Delta f_i(t)}{dt} = \Delta P_i(t);$$

which is further converted into:

$$H_i = \frac{\Delta P_i(t)}{2\frac{d\Delta f_i(t)}{dt}};$$

wherein $H_i$ is an inertia value of node i, and represents a magnitude of a hindering effect of the inertia of the power system on a frequency change of the node i during a $\Delta P_i$–$d\Delta f_i/dt$ process; $\Delta f_i$ is a node frequency deviation; and $\Delta P_i$ is an increment of the node injection power;

using Laplace transform to convert a time domain relationship among the node inertia, the node frequency and the node injection power into a continuous frequency domain expression, wherein the continuous frequency domain expression is a continuous transfer function comprising an information of the node inertia, and the continuous transfer function is expressed as follows:

$$G(s) = \frac{\Delta f_i(s)}{\Delta P_i(s)} = \frac{1}{2H_i s};$$

wherein $\Delta f_i(s)$ is a frequency domain expression of the node frequency deviation; $\Delta P_i(s)$ is a frequency domain expression of the increment of the node injection power; and s is a Laplace operator;

thus, a pole-zero gain value of a model of the continuous transfer function is an initial impulse response value, which equals to a reciprocal of twice the node inertia;

constructing the OEMA model to describe the active power-frequency dynamic change process of each node; converting solving of the node inertia into identification of the unknown parameter of the OEMA model; and analyzing the coupling relationship between the unknown parameter of the OEMA model and the node inertia; wherein an expression of the OEMA model is shown as follows:

$$y(t) = \frac{B(z)}{A(z)}u(t) + D(z)v(t)$$

$$x(t) = \frac{B(z)}{A(z)}u(t);$$

wherein $A(z)=1+a_1 z^{-1}+\ldots+a_{n_a} z^{-n_a}$; $B(z)=b_1 z^{-1}+\ldots+b_{n_b} z^{-n_b}$; $D(z)=1+d_1 z^{-1}+\ldots+d_{n_d} z^{-n_d}$; y(t) is an output sequence of the OEMA model to be identified; u(t) is an input sequence of the OEMA model to be identified; v(t) is a zero-mean Gaussian random white noise sequence; x(t) is an internal variable, which represents an actual undetectable variable of the power system; $z^{-1}$ is a unit backshift operator, expressed as $z^{-}y(t)=y(t-1)$; and $a_{n_a}$, $b_{n_b}$, $d_{n_d}$ represent parameters to be identified of the OEMA model.

In an embodiment, the second calculating unit is operated through steps of:
expanding a single innovation describing the active power-frequency dynamic change process of each node into multiple innovations to generate a multi-innovation matrix to strengthen an identification precision of the unknown parameter in the OEMA model established by the first calculating unit, wherein the multi-innovation matrix is expressed as follows:

$$\begin{bmatrix} X(p,t) \\ Y(p,t) \\ V(p,t) \\ \psi(p,t) \end{bmatrix} = \begin{bmatrix} x(t), x(t-1), \ldots, x(t-p+1) \\ y(t), y(t-1), \ldots, y(t-p+1) \\ v(t), v(t-1), \ldots, v(t-p+1) \\ \varphi(t), \varphi(t-1), \ldots, \varphi(t-p+1) \end{bmatrix};$$

wherein $\varphi(t)$ is an information vector comprising the internal variable x(t) and $\varphi(t)=[-x(t-1), \ldots, -x(t-n_a), u(t-1), \ldots, u(t-n_b), v(t-1), \ldots, v(t-n_d)]^T$; X(p,t) is an accumulated internal variable; Y(p,t) is a first accumulated output variable; V(p,t) is an accumulated noise variable; $\psi$(p,t) is a first accumulated information matrix; and p is the number of an innovation vector;

replacing an internal undetectable variable of the OEMA model with an output of an auxiliary model based on an auxiliary model identification idea using an actual measured information to further eliminate an impact of noise contained in an input data of the OEMA model; wherein the auxiliary model is expressed as follows:

$$\hat{x}(t) = \varphi_S^T(t)\theta_S;$$

wherein, $\varphi_S(t)=[-x(t-1), \ldots, -x(t-n_a), u(t-1), \ldots, u(t-n_b)]^T$, $\theta_S=[a_1, a_2, \ldots, a_{n_a}, b_1, b_2, \ldots, b_{n_b}]$ is a vector of the parameter to be identified $a_{n_a}$, $b_{n_b}$; and setting a criterion function; obtaining an optimal identification result of the parameter of the OEMA model on a basis of a least squares estimation principle on the premise of allowing the criterion function to be minimum, to obtain a value of all unknown parameters of the OEMA model, wherein the criterion function is expressed as follows:

$$J(\theta) := \sum_{i=1}^{t} \|Y(p,i) - \psi^T(p,i)\theta\|^2;$$

wherein, Y(p,i) is a second accumulated output vector; $\psi$(p,i) is a second accumulated information matrix; $\varphi$=[$a_1$, $a_2$, \ldots, $a_{n_a}$, $b_1$, $b_2$, \ldots, $b_{n_b}$, $d_1$, $d_2$, \ldots, $d_{nd}$] represents a vector of the parameter to be identified $a_{n_a}$, $b_{n_b}$, $d_{n_d}$; p is the number of the innovation vector.

In an embodiment, the analyzing unit is operated through steps of:

considering what the OEMA model built by the first calculating unit describes is a dynamic behavior of a discrete system, establishing a mapping relationship between a z-plane and an s-plane based on bilinear transformation (Tustin method); and according to the vector of the parameter of the OEMA model identified by the second calculating unit, obtaining an undetermined parameter of a continuous transfer function corresponding to the OEMA model;

performing an inverse Laplace transformation on the obtained transfer function to obtain an impulse response of a corresponding control system; and taking an initial response value to obtain the reciprocal of twice the nodal inertia, thereby estimating a size of the node inertia; and after solving an inertia value of each node of a power grid, estimating the spatial distribution of the inertia of the power system; and visually displaying the spatial distribution of the inertia of the power system by combining a geographic information of each node.

In an embodiment, the bilinear transformation is configured to realize a mapping from the z-plane to the s-plane, and is expressed as follows:

$$z = \frac{e^{sT/2}}{e^{-sT/2}} \approx \frac{1 + sT/2}{1 - sT/2};$$

wherein, z is a sampling Laplace operator; s is the Laplace operator; and T is a sampling period.

In an embodiment, a discrete transfer function described by the OEMA model is expressed as follows:

$$G'(z) = \frac{B(z)}{A(z)};$$

the discrete transfer function is converted into the continuous transfer function, expressed as follows:

$$G'(s) = \frac{b'_{n-1}s^{n-1} + \ldots + b'_1 s^1 + b'_0}{a'_n s^n + \ldots + a'_1 s^1 + a'_0};$$

wherein, $b_{n-1}'$, \ldots, $b_0'$, $a_n'$, \ldots, $a_0'$ are coefficients of a model of the continuous transfer function; and s is the Laplace operator.

In an embodiment, the frequency signal is decomposed and reconstructed under the Daubechies Wavelet to detect the singular point of the frequency signal to identify an initial moment of a response of the inertia of the power system, wherein an expression of the wavelet multi-resolution analysis is shown as follows:

$$W_f(a,b) = \langle f, \psi_{a,b} \rangle = |a|^{-1/2} \int_{-\infty}^{+\infty} f(t)\psi\left(\frac{t-b}{a}\right)dt;$$

wherein, $\psi_{a,b}(t)$ is a mother wavelet function, and herein is the Daubechies Wavelet; a is a scale coefficient; b is a translating coefficient; and f(t) is an acquired frequency signal.

Compared with the prior art, this disclosure has the following beneficial effects.

1. The method provided herein can offer a precise estimation for the spatial distribution of the power system inertia. Compared with the conventional inertia estimation methods, the method provided herein establishes an analytical relationship among the node inertia, the node frequency and the node injection power, and estimates the node inertia based on the output error moving average (OEMA) model, thereby refining the estimation of the inertia spatial distribution to a node level. By estimating the inertia of each node in the system, the spatial distribution of the power system inertia can be obtained, facilitating helping the dispatching personnel accurately locate the weak-inertia regions, and arriving at the deep analysis of the distribution of system inertia.

2. The model constructed herein for estimating the spatial distribution of the inertia is of strong robustness. The OEMA model constructed for describing the active power-frequency dynamic change process of the node is a high-order model, in which the time-series data information, such as the node frequency, is fully considered. Compared with a low-order model merely using the node data at a single moment for estimating the node inertia, the high-order model can effectively overcome the interference of a large number of random factors such as data measurement noise, and avoid being excessively affected by the accuracy of data measurement at a single moment, allowing for a strong robustness.

3. The model constructed herein for estimating the spatial distribution of the inertia can be fast and effectively solved. Considering that the constructed model is a high-order model, the single innovation is expanded to the multiple innovations to match the model, and by means of the multi-innovation identification, the identification accuracy is enhanced, so that the node inertia can be fast and effectively estimated in a short time, analyzing the spatial distribution of the inertia of the system.

4. The model for estimating the inertia spatial distribution has desirable adaptability for the disturbance fault. Since the constructed OEMA model comprehensively considers the coupling relationship between the node inertia, the node frequency and the node injection power, and uses the time-series information of the node data, it can effectively overcome the impact of the disturbance fault on the estimation result of the inertia spatial distribution, achieving the accurate estimation of the spatial distribution of the system inertia under various disturbances (varying in location and intensity).

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The drawings described herein are intended to facilitate the understanding of the application, which are merely illustrative and are not intended to limit the disclosure.

DETAILED DESCRIPTION OF EMBODIMENTS

Figure 1:
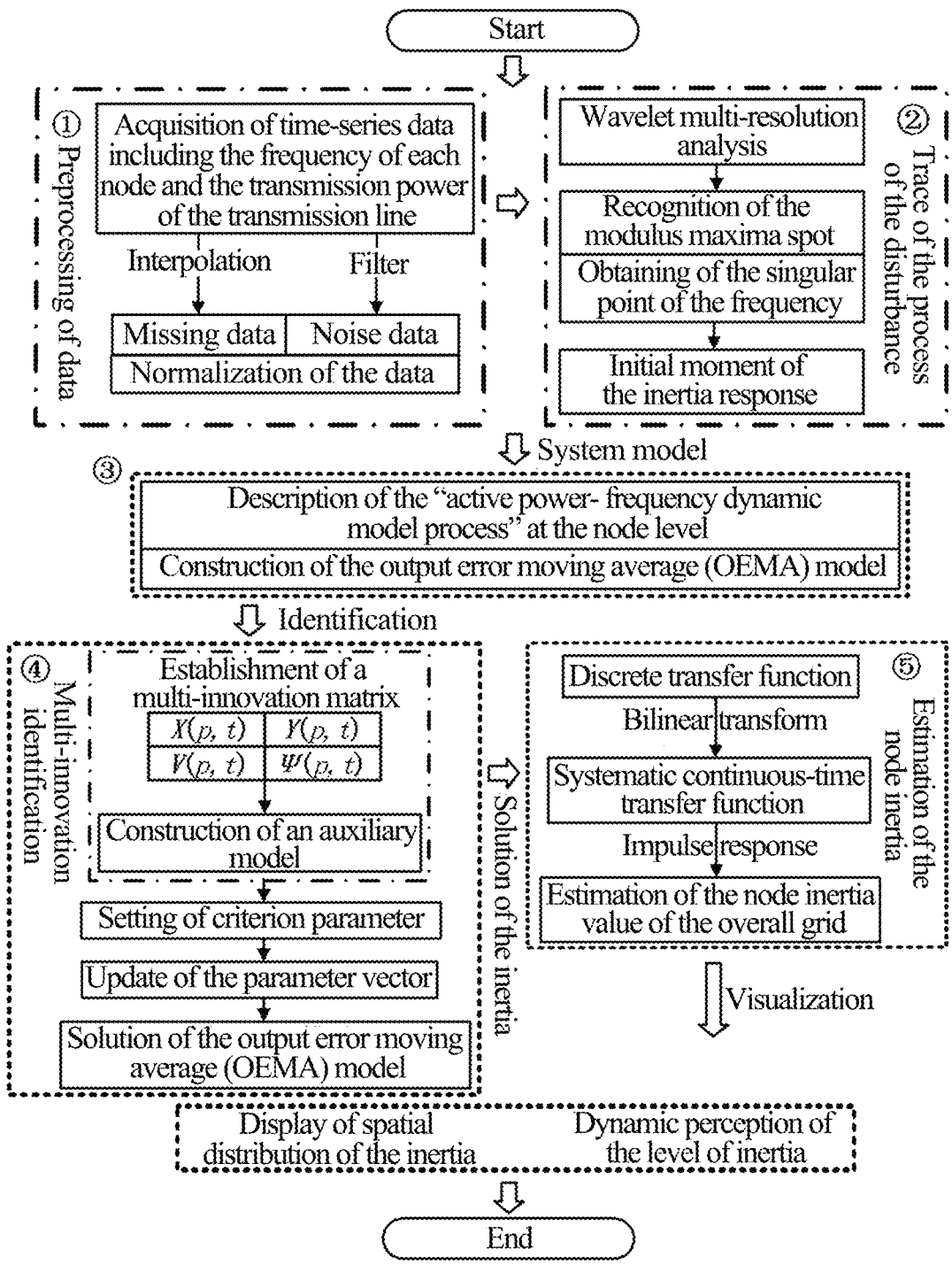
FIG. 1 is a flowchart of a method for estimating spatial distribution of an inertia of a power system based on multi-innovation identification according to an embodiment of this disclosure.

The disclosure will be described in detail below with reference to the embodiments and accompanying drawings to make the objectives, technical solutions, and advantages of the disclosure clearer. It should be understood that these embodiments are only illustrative of the disclosure, and are not intended to limit the disclosure.

A large number of specific details are described below to provide a thorough understanding of this disclosure. However, it is obvious for those skilled in the art that the present application can be implemented without some of these specific details. In other embodiments, the structures, electric circuits, materials and methods commonly known in the art are not specifically described to avoid obscuring this disclosure.

Throughout the description, references to "one embodiment", "an embodiment", "one example", or "an example" mean that a specific feature, structure, or characteristic described in conjunction with the embodiment or example is included in at least one embodiment of this disclosure. Thus, as used herein, the phrase "one embodiment", "an embodiment", "one example" or "an example" does not necessarily refer to the same embodiment or example. Additionally, specific features, structures, or characteristics can be combined in any appropriate combination and/or sub-combination in one or more embodiments or examples. Apart from that, it should be understood by those of ordinary skill in the art that the drawings provided herein are only illustrative, and the drawings are not necessarily drawn to scale. The term "and/or" used herein is intended to include any and all combinations of one or more of the listed items.

As used herein, it should be understood that the orientation or position relationship indicated by terms "front", "rear", "left", "right", "upper", "lower", "vertical", "horizontal", "high", "low", "inner" and "outer" is based on the orientation or position relationship shown in the accompanying drawings, and is only for the convenience of describing this disclosure and simplifying the description, rather than indicating or implying that the referred device or element must have a specific orientation or be constructed or operated in a specific orientation. Therefore, these terms cannot be understood as a limitation for the protection scope of this disclosure.

Embodiment 1

Referring to an embodiment shown in FIGS. 1-5, a method for estimating spatial distribution of an inertia of a power system is illustrated, which includes the following steps.

(S1) A time-series data is acquired and preprocessed, where the time-series data includes a frequency of each node of the power system and a transmission power of a transmission line. A frequency signal is decomposed in a series of different spaces to accurately identify a moment when a disturbance occurs and rapidly trace an impact of the disturbance.

(S2) A relationship among a node inertia, a node frequency, a node injection power is analyzed. An output error moving average (OEMA) model is constructed to describe an active power-frequency dynamic process of each node after the disturbance, and a coupling relationship between an unknown parameter in the OEMA model and the node inertia is analyzed.

(S3) The OEMA model is solved by adopting a multi-innovation identification to identify the unknown parameter of the OEMA model.

(S4) An inertia of each node is calculated by using the unknown parameter of the OEMA model identified in step (S3) according to an analytical relationship between a vector of the unknown parameter and the node inertia to estimate a spatial distribution of the inertia of the power system.

In this embodiment, the acquisition and preprocess of the data are as follows.

A data for estimating the spatial distribution of the inertia of the power system in real time is acquired by using a synchronized phasor measurement unit (PMU), in which the data includes the frequency of each node, the transmission power of the transmission line, a node load and an electromagnetic power of a generator. The obtained data is preprocessed, in which the preprocessing of the data includes: interpolation of a missing data and elimination of a data measurement noise adopting a filtering method. The preprocessed time-series data is normalized to form a dataset in a standard form for analyzing the node inertia, thereby estimating the spatial distribution of the inertia of the power system.

The identification of the moment when the disturbance occurs is described as follows.

The frequency signal is decomposed in the series of different spaces based on wavelet multi-resolution analysis using a Daubechies Wavelet. And a wavelet detail coefficient at each level is extracted to determine a modulus maxima spot, thereby detecting a singular point of the frequency signal, in which the identified singular point of the frequency signal is an initial time when the disturbance occurs. An expression of a decomposition of the frequency signal based on the Daubechies Wavelet basis is shown as follows:

$$W_f(a, b) = \langle f, \psi_{a,b} \rangle = |a|^{-1/2} \int_{-\infty}^{+\infty} f(t)\psi\left(\frac{t-b}{a}\right)dt;$$

where $\psi_{a,b}(t)$ is a mother wavelet function, which is the Daubechies Wavelet basis; a is a scale coefficient; b is a translating coefficient; and f(t) is an acquired frequency signal.

The construction of the model of estimation of the node inertia is as follows.

The node inertia is used to characterize the intensity of the inertia at different electrical positions of the power system by estimating each node inertia value of the power system, so as to assess the specific situation of the spatial distribution of the power system. The node inertia is an inherent property of system inertia that hinders the node frequency change during the process of the energy fluctuation in the power system, which measures the ability of the node to resist active power disturbance under the combined action of all inertia resources. In terms of a mechanism of a frequency response of the power system, the coupling relationship among the node inertia, the node frequency and the node injection power at the stage of the inertia response after the disturbance fault is expressed as follows:

$$2H_i \frac{d\Delta f_i(t)}{dt} = \Delta P_i(t); \quad (2.1)$$

which is further converted into:

$$H_i = \frac{\Delta P_i(t)}{2\frac{d\Delta f_i(t)}{dt}}; \quad (2.2)$$

where $H_i$ is an inertia value of node i, and represents a magnitude of a hindering impact of the inertia of the power system on a frequency change of the node i during a transient process; $\Delta f_i$ is a node frequency deviation; $\Delta P_i$ is an increment of the node injection power.

The continuous transfer function corresponding to the relationship among the node inertia, the node frequency and the node injection power in equation (2.1) is expressed as follows:

$$G(s) = \frac{\Delta f_i(s)}{\Delta P_i(s)} = \frac{1}{2H_i s}. \quad (3)$$

It can be seen from equation (3) that a pole-zero gain value of a model of the continuous transfer function is an initial impulse response value, which equals to a reciprocal of twice the node inertia $H_i$ mathematically.

As equation (2.1) shows, the node inertia information reflected during the process of the node active power-frequency dynamic change, and equation (3) shows that if the pole-zero gain value of G(s) is obtained, the node inertia is estimated. In order to avoid being excessively affected by the accuracy of data measurement at a single moment, in which an expression of the OEMA model describing the process is shown as follows:

$$y(t) = \frac{B(z)}{A(z)}u(t) + D(z)v(t)$$

$$x(t) = \frac{B(z)}{A(z)}u(t);$$

in which, $A(z)=1+a_1z^{-1}+ \ldots +a_{n_a}z^{-n_a}$, $B(z)=b_1 z^{-1}+ \ldots +b_{n_b}z^{-n_b}$, $D(z)=1+d_1z^{-1}+ \ldots +d_{n_d}z^{-n_d}$, y(t) is an output sequence of a model to be identified (OEMA model); u(t) is an input sequence of the model to be identified (OEMA model); v(t) is a zero-mean Gaussian random white noise sequence; x(t) is an internal variable, which represents an actual undetectable variable of the power system, $z^{-1}$ is a unit backshift operator expressed as $z^{-1}y(t)=y(t-1)$; and $a_{n_a}$, $b_{n_b}$, $d_{n_d}$ represents parameters to be identified of the OEMA model.

The identification based on the multi-innovation identification of the unknown parameter in the OEMA model is as follows.

From the above, the unknown parameter in the OEMA model is firstly identified to assess the node inertia. The innovation is a useful information for improving the estimation accuracy of the parameters or the state estimation accuracy of the state. The multi-innovation identification expands the original single innovation to multiple innovations. With the use of the variable length of the innovation, the node data measured by the phasor measurement unit (PMU) is fully utilized to improve the utilization efficiency of the data, and strengthen the identification precision of the system. In the multi-innovation identification, p (p is the number of innovations) groups of the data in the data windows from (t−p+1) to t, an expanded internal variable x(t), an output vector y(t), an noise vector v(t), an information vector φ(t) are considered to establish a multi-innovation matrix, which is shown as follows:

$$\begin{bmatrix} X(p,t) \\ Y(p,t) \\ V(p,t) \\ \psi(p,t) \end{bmatrix} = \begin{bmatrix} x(t), x(t-1), \ldots, x(t-p+1) \\ y(t), y(t-1), \ldots, y(t-p+1) \\ v(t), v(t-1), \ldots, v(t-p+1) \\ \varphi(t), \varphi(t-1), \ldots, \varphi(t-p+1) \end{bmatrix} \quad (5)$$

in which, φ(t) is an information vector including the internal variable x(t), and $\varphi(t)=[-x(t-1), \ldots, -x(t-n_a), u(t-1), \ldots, u(t-n_b), v(t-1), \ldots, v(t-n_d)]^T$; X(p,t) is an accumulated internal variable, Y(p,t) is a first accumulated output vector, v(p,t) is an accumulated noise variable, ψ(p,t) is a first accumulated information matrix.

The frequency data actually acquired by the phasor measurement unit (PMU) usually includes the random noise, which is difficult to fully reflect the actual frequency dynamic process of the node. Therefore, the auxiliary model identification idea is adopted. With the assist of the measurable information of the system, the output of the auxiliary model $\hat{x}(t)$ replaces the undetectable variable x(t) in the system to further strengthen the identification precision of the unknown parameters in the OEMA model. The auxiliary model is expressed as follows:

$$\hat{x}(t) = \varphi_S^T(t)\theta_S \quad (6);$$

wherein, $\varphi_S(t) = [-x(t-1), \ldots, -x(t-n_a), u(t-1), \ldots, u(t-n_b)]^T$, and $\theta_S = [a_1, a_2, \ldots, a_{n_a}, b_1, b_2, \ldots, b_{n_b}]$ is a vector of the parameter to be identified.

Auxiliary model-based multi-innovation extended least-squares algorithm (AM-MI-ELS algorithm, hereinafter referred to as "multi-innovation identification") is adopted to take the node injection power as an input, and the node frequency as an output, so as to update the estimation results of the unknown parameters constantly and fast, and each fast updated result is expressed as follows:

$$\hat{\theta} = \left[\sum_{i=1}^{t}\psi(p,i)\psi^T(p,i)\right]^{-1}\left[\sum_{i=1}^{t}\psi(p,i)Y^T(p,i)\right]; \quad (7)$$

the prediction error is made as less as possible, and the setting criterion function is as follows:

$$J(\theta) := \sum_{i=1}^{t}\|Y(p,i) - \psi^T(p,i)\theta\|^2; \quad (8)$$

based on the optimal estimation of the least squares principle, when the identification result is updated till the criterion function is minimum, the unknown parameters in the OEMA model is identified.

The estimation of the node inertia is as follows:

The OEMA model is a discrete model, and the discrete transfer function corresponding to it is as follows:

$$G'(z) = \frac{B(z)}{A(z)}; \quad (9)$$

a mapping relationship between a z-plane and an s-plane is constructed to convert the discrete transfer function into the continuous transfer function based on bilinear transform (Tustin's transform), and is expressed as follows:

$$z = \frac{e^{sT/2}}{e^{-sT/2}} \approx \frac{1+sT/2}{1-sT/2}; \quad (10)$$

the continuous transfer function after the transform is expressed as follows:

$$G'(s) = \frac{b'_{n-1}s^{n-1} + \ldots + b'_1 s^1 + b'_0}{a'_n s^n + \ldots + a'_1 s^1 + a'_0} \quad (11)$$

where $b'_{n-1}, \ldots, b'_0, a'_n, \ldots, a'_0$ are undetermined coefficients of a model of the continuous transfer function; and s is the Laplace operator.

The discrete transfer function G'(z) corresponding to the OEMA model is performed with the Laplace transform to obtain a continuous transfer function G'(s) and G'(s) is performed with the inverse Laplace transform to obtain an impulse response of a corresponding control system. The initial response value is taken to obtain a reciprocal of twice the node inertia, thereby estimating the magnitude of the node inertia.

After an inertia value of each node of the power grid is solved, the spatial distribution of the inertia of the power system is estimated and expressed as follows:

$$H = \{H_i | i = 1, 2, \ldots, n\} \quad (12);$$

in which, H is a collection of all node inertia of the power grid, reflecting the specific situation of the spatial distribution of the inertia of the power system, n is the number of the nodes of the power system.

On the basis of equation (12), the information of the node inertia size and the node geographic location obtained by fusion calculation are visualized to realize the visual display of the spatial distribution of the inertia of the power system.

Figure 2:
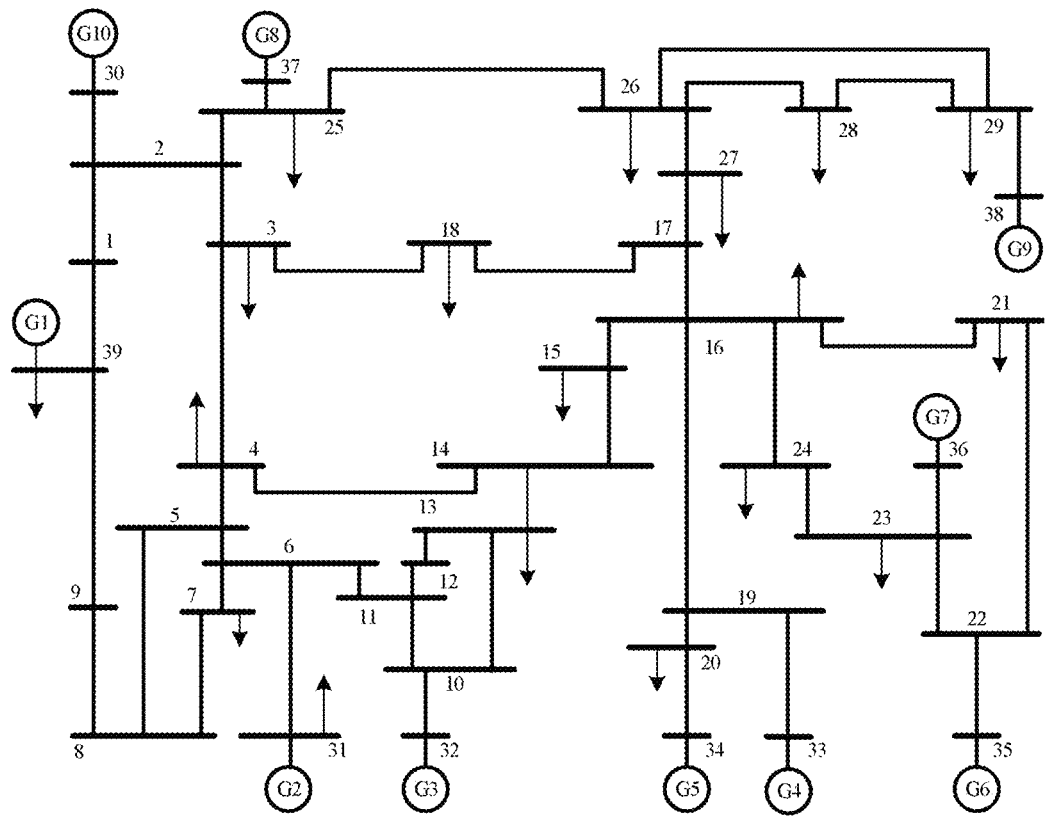
FIG. 2 is a topological structure diagram of an IEEE-39 bus system according to an embodiment of this disclosure.

Based on the above, the method for estimation of spatial distribution of the inertia of the power system based on multi-innovation identification is applied to the New England IEEE 39-Bus System to assess the spatial distribution of the inertia of the power system. The calculation result of the frequency stability simulates the synchronization measurement result by the phasor measurement unit (PMU) in the actual system. In FIG. 2, the topological structure diagram of the IEEE 39 bus system is shown, and 10 generators are provided herein, with the total load of the system of 6150 MW and the rated frequency of 50 Hz. The model parameters used by the generator are shown in Table 1.

TABLE 1

Parameters of the generator models

| Generator | H | $x'_d$ | $x'_q$ | $x_d$ | $x_q$ | $T'_{d0}$ | $T'_{q0}$ | $x_l$ |
|---|---|---|---|---|---|---|---|---|
| 1 | 5.95 | 0.060 | 0.080 | 0.200 | 0.19 | 7.00 | 0.70 | 0.030 |
| 2 | 2.58 | 0.697 | 1.700 | 2.950 | 2.82 | 6.56 | 1.50 | 0.350 |
| 3 | 3.90 | 0.531 | 0.876 | 2.495 | 2.37 | 5.70 | 1.50 | 0.304 |
| 4 | 3.20 | 0.436 | 1.660 | 2.620 | 2.58 | 5.69 | 1.50 | 0.295 |
| 5 | 3.62 | 1.320 | 1.660 | 6.700 | 6.20 | 5.40 | 0.44 | 0.540 |
| 6 | 3.79 | 0.500 | 0.814 | 2.540 | 2.41 | 7.30 | 0.40 | 0.224 |
| 7 | 3.34 | 0.490 | 1.860 | 2.950 | 2.92 | 5.66 | 1.50 | 0.322 |
| 8 | 3.18 | 0.570 | 0.911 | 2.900 | 2.80 | 6.70 | 0.41 | 0.280 |
| 9 | 2.94 | 0.570 | 0.587 | 2.106 | 2.05 | 4.79 | 1.96 | 0.298 |
| 10 | 3.54 | 0.310 | 0.080 | 1.000 | 0.69 | 10.20 | 0 | 0.125 |

During the simulation analysis, to analyze the adaptability of the proposed methods for estimation of the spatial distribution of power system inertia to different disturbance faults varying in intensity, the fault scenarios varying in intensity are set as follows.

In a large disturbance scenario, the specific setting of the large-disturbance fault is as follows. At 10 s, a total load of 615 MW (approximately 10% of the total load) is removed at bus #20, to verify the effectiveness of this method in estimating the spatial distribution of the inertia under the condition of large disturbance.

In a small disturbance scenario, the specific setting of the small-disturbance fault is as follows. At nodes of #4, #7, #15, #20, #23, #27, the small load disturbance of 100 MW (approximately 1.63% of the total load) is added to simulate the small disturbance fault such as the load switching during the operation of the stable state of the system, so as to verify the effectiveness of this method in estimating the spatial distribution of the inertia under the conditions of small disturbance or quasi-stable-state.

The general nodes are considered to have no accurate inertia value for comparison and verification, so the active power-frequency data of the generator node after the fault is selected to estimate the inertia of each synchronous unit. The results are shown in Table 2. The inertia time constant of the generator is based on its rated capacity.

TABLE 2

Estimation results of inertia time constant of generators

| Gen-erator number | Actual inertia of generator/s | Large disturbance fault | | Small disturbance fault | |
|---|---|---|---|---|---|
| | | Estimated value/s | Erroll % | Estimated value/s | Erroll % |
| G1 | 5.95 | 6.10 | 2.61 | 5.82 | 2.24 |
| G2 | 2.58 | 2.68 | 4.10 | 2.47 | 3.97 |
| G3 | 3.90 | 3.97 | 1.90 | 3.75 | 3.76 |
| G4 | 3.20 | 3.31 | 3.23 | 3.06 | 4.40 |
| G5 | 3.62 | 3.70 | 2.08 | 3.55 | 1.98 |
| G6 | 3.79 | 3.72 | 1.90 | 3.62 | 4.49 |
| G7 | 3.34 | 3.28 | 1.84 | 3.40 | 1.74 |
| G8 | 3.18 | 3.03 | 4.97 | 3.14 | 1.30 |
| G9 | 2.94 | 2.98 | 1.08 | 3.11 | 5.62 |
| G10 | 3.54 | 3.60 | 1.74 | 3.72 | 5.02 |

As shown in Table 2, the multi-innovation identification is adopted to compare the estimated inertia value of each unit with the actual inertia value. Under the condition of large disturbance fault, the estimated error of the inertia of each unit is within 5%, the minimum error is 1.08%, and the maximum error is 4.97%. Under condition of small disturbance fault, the estimated error of the inertia of each unit is within 6%, the minimum error is 1.3%, and the maximum error is 5.62%. It illustrates that the selection of the data obtained after the disturbances varying in intensity for identifying the inertia of the generator has almost no impact on the estimation result, which verifies that the method for estimation of the spatial distribution of inertia based on the multi-innovation identification herein accurately analyzes the spatial distribution of the power system inertia under disturbances varying in intensity.

In this embodiment, the disturbance faults varying in intensity and location are set to verify the adaptability of the method for estimation of the spatial distribution of the inertia to disturbances varying in location. During the simulation analysis, the settings of the fault are as follows.

Scenario 1: at 10 s, the load at node #3 is cut off to 200 MW (approximately 3.25% of the total load).

Scenario 2: at 10 s, the load at node #8 is cut off to 200 MW (approximately 3.25% of the total load).

Scenario 3: at 10 s, the load at node #15 is cut off to 200 MW (approximately 3.25% of the total load).

Scenario 4: at nodes of #4, #7, #15, #20, #23, #27, a small load disturbance of 100 MW (about 1.63% of the total load) is added to simulate the fluctuation of the overall active power in the system during the normal operation.

Figure 3:
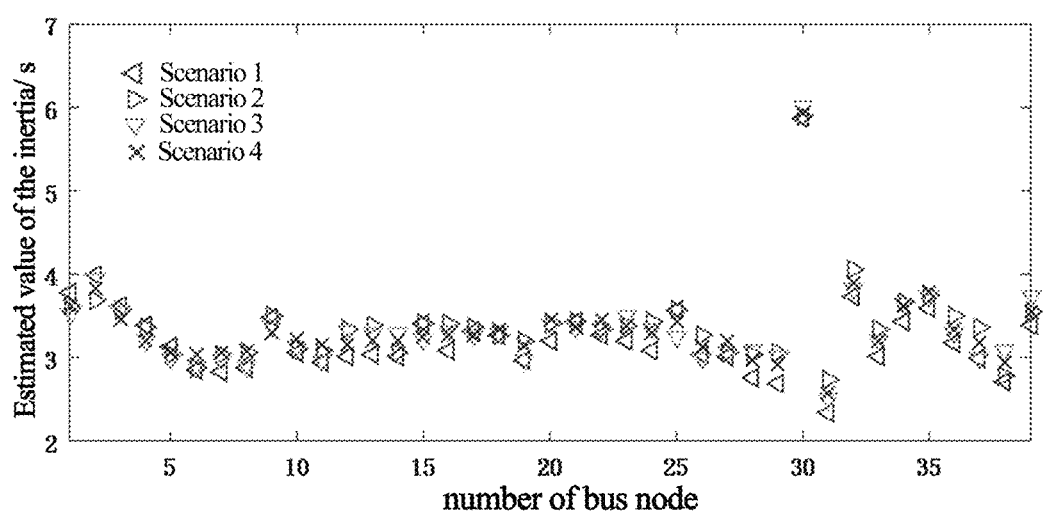
FIG. 3 schematically illustrates estimation results of a node inertia under disturbances varying in location and intensity according to an embodiment of this disclosure.

In FIG. 3, the estimation results of a node inertia under disturbances varying in location are given. It can be seen from FIG. 3 that the estimated values of the node inertia under disturbances varying in location and intensity based on the method provided herein are very close. Among the 39 nodes of the overall system, the deviation between the maximum and minimum values of the estimation results of the inertia is within 0.4 s, and the estimated result of the inertia is of no outlier. It illustrates that the model of the estimation of the spatial distribution of the inertia herein is of good adaptability to different disturbances and strong robustness.

Figure 4:
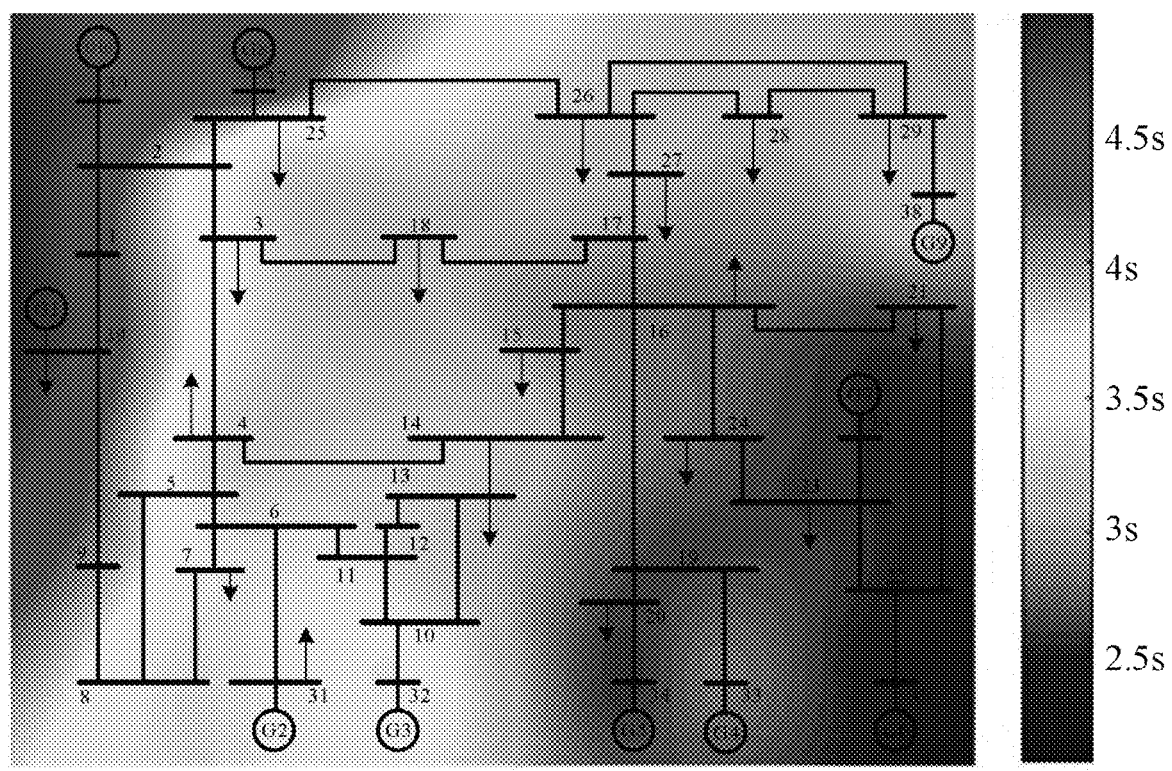
FIG. 4 is a visual display diagram of the inertia spatial distribution obtained by the method of this disclosure.

The IEEE 39 bus system topology is mapped to the two-dimensional x-y plane, which represents the actual geographic wiring diagram as the foundation of the visualization. The node inertia and the information of node geographic location are, obtained by fusion calculation on the two-dimensional plane to realize the visualization of the system inertia spatial distribution. The inertia of each synchronous unit in this scenario is shown in Table 3, which is based on the rated capacity of the generator itself, with a reference frequency $f_N$=50 Hz. The estimation result of each node inertia in the grid is shown in Table 4, and the visual display diagram is shown in FIG. 4.

TABLE 3

Parameters of the generator models

| Generator | H | $x'_d$ | $x'_q$ | $x_d$ | $x_q$ | $T'_{d0}$ | $T'_{q0}$ | $x_l$ |
|---|---|---|---|---|---|---|---|---|
| 1 | 4.6 | 0.060 | 0.080 | 0.200 | 0.19 | 7.00 | 0.70 | 0.030 |
| 2 | 3.5 | 0.697 | 1.700 | 2.950 | 2.82 | 6.56 | 1.50 | 0.350 |
| 3 | 3.7 | 0.531 | 0.876 | 2.495 | 2.37 | 5.70 | 1.50 | 0.304 |
| 4 | 2.8 | 0.436 | 1.660 | 2.620 | 2.58 | 5.69 | 1.50 | 0.295 |
| 5 | 2.6 | 1.320 | 1.660 | 6.700 | 6.20 | 5.40 | 0.44 | 0.540 |
| 6 | 2.5 | 0.500 | 0.814 | 2.540 | 2.41 | 7.30 | 0.40 | 0.224 |
| 7 | 2.6 | 0.490 | 1.860 | 2.950 | 2.92 | 5.66 | 1.50 | 0.322 |
| 8 | 4.6 | 0.570 | 0.911 | 2.900 | 2.80 | 6.70 | 0.41 | 0.280 |
| 9 | 3.1 | 0.570 | 0.587 | 2.106 | 2.05 | 4.79 | 1.96 | 0.298 |
| 10 | 4.5 | 0.310 | 0.080 | 1.000 | 0.69 | 10.20 | 0 | 0.125 |

TABLE 4

Estimation results of node inertia in the grid

| Node number | Node inertia/s |
|---|---|
| 1 | 4.18 |
| 2 | 3.84 |
| 3 | 3.39 |
| 4 | 3.29 |
| 5 | 3.35 |
| 6 | 3.34 |
| 7 | 3.39 |
| 8 | 3.41 |
| 9 | 3.94 |
| 10 | 3.31 |
| 11 | 3.32 |
| 12 | 3.28 |
| 13 | 3.28 |
| 14 | 3.20 |
| 15 | 2.93 |
| 16 | 2.83 |
| 17 | 3.00 |
| 18 | 3.13 |
| 19 | 2.65 |
| 20 | 2.70 |
| 21 | 2.70 |
| 22 | 2.59 |
| 23 | 2.62 |
| 24 | 2.80 |
| 25 | 3.82 |
| 26 | 3.19 |
| 27 | 3.09 |
| 28 | 3.06 |
| 29 | 3.04 |
| 30 | 2.70 |
| 31 | 4.80 |
| 32 | 3.32 |
| 33 | 3.51 |
| 34 | 2.62 |
| 35 | 2.56 |
| 36 | 2.56 |
| 37 | 2.50 |
| 38 | 4.53 |
| 39 | 2.92 |

As illustrated in FIG. 4, the inertia of the left region of the system is greater than 4 s, the inertia of the right region is less than 3 s, and the inertia of the middle region is between 3 s-4 s. The distribution of the system inertia gradually decreases from the upper left to the lower right, which is consistent with the distribution of the actual system inertia, verifying the effectiveness of method for estimating the spatial distribution of the inertia based on multi-innovation identification.

Figure 5:
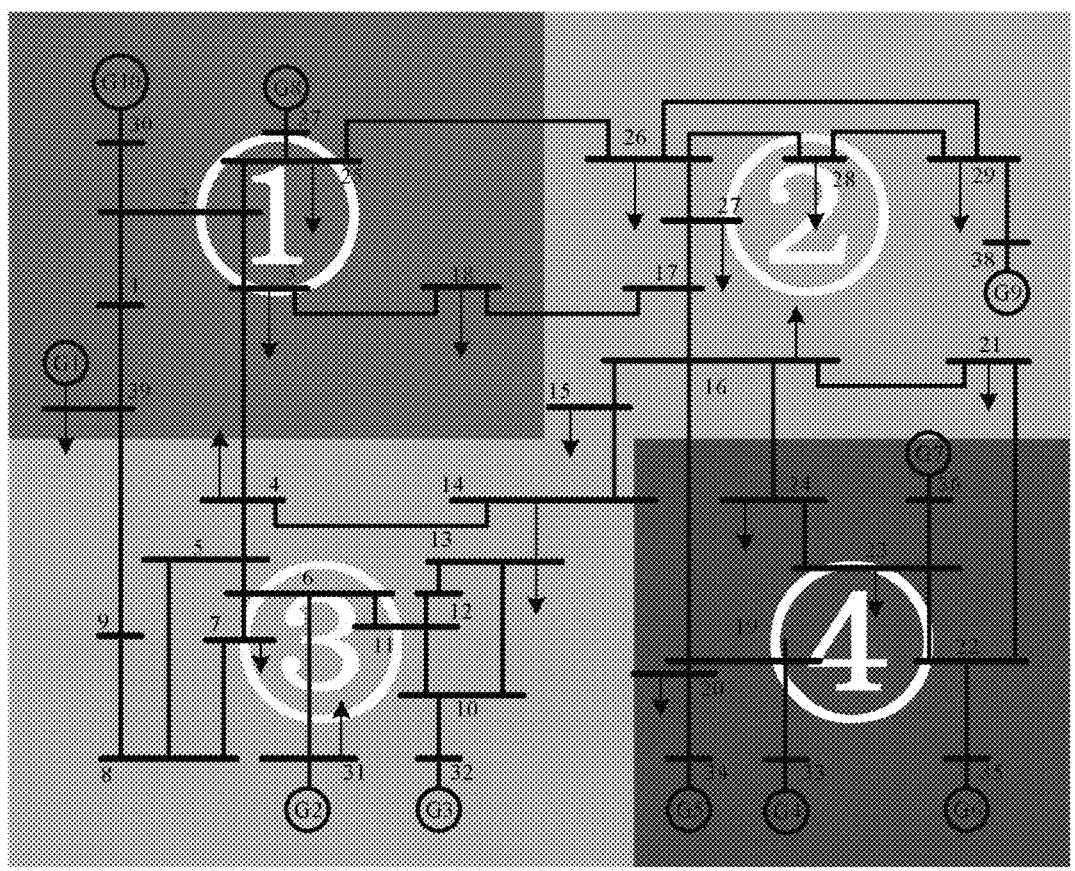
FIG. 5 is a visual display diagram of the inertia level of the regional power grid obtained based on a conventional method.

As illustrated in FIG. 5, based on the visual display diagram of the inertia level of the regional power grid obtained by the conventional methods, the power system is divided into four regions, and the equivalent inertia of each region is solved as follows. The equivalent inertia of region 1 is 4.47 s. The equivalent inertia of region 2 is 3.5 s. The equivalent inertia of region 3 is 3.6 s. The equivalent inertia of region 4 is 2.63 s. Compared with FIGS. 4 and 5, it shows that taking the region as a research object in the spatial distribution of the inertia merely reflects the average situation of equivalent inertia in a certain region, which is difficult to show the internal spatial distribution in detail. However, in this disclosure, the method for estimating the spatial distribution of the inertia based on multi-innovation identification estimates the inertia values of all nodes in the system to clarify the specific situation of the spatial distribution of system inertia, providing more effective information for the dispatch and operation personnel to dig out the regions with weak inertia.

In summary, in this disclosure, the method for estimating the spatial distribution of the inertia based on multi-innovation identification estimates the overall spatial distribution of the inertia of the power system by estimating the inertia value of each node in the system, thereby refining the analysis of the spatial distribution of the inertia to a node level. And during the process of estimating the spatial distribution of the inertia of the system, this method is almost free of the impact by the disturbance intensity and disturbance location, and is of good adaptability to different disturbances and strong robustness. Meanwhile, the time that the method based on multi-innovation identification takes to solve the model is milliseconds, which is capable of meeting the requirement of the real-time analysis for actual operation of the power system during the analytical process, and effectively help the dispatching personnel accurately dig out the weak-inertia regions, facilitating improving the adaptability of the access of the regional renewable energy/DC and the operation safety and stability of the system.

Embodiment 2

As illustrated in FIGS. 1-5, a device for implementing the method of Embodiment 1 is provided herein. The device includes an acquiring unit, a first calculating unit, a second calculating unit, and an analyzing unit. The acquiring unit is configured to acquire a time-series data and preprocess the time-series data, in which the time-series data includes a frequency of each node of a power system and a transmission power of a transmission line. The acquiring unit is also configured to decompose a frequency signal on a series of different spaces to identify a moment when a disturbance occurs, and fast trace an impact of the disturbance.

The first calculating unit is configured to analyze a relationship among a node inertia, a node frequency and a node injection power, construct an output error moving average (OEMA) model to describe an active-power-frequency dynamic process of each node after the disturbance, and analyze a coupling relationship between an unknown parameter of the OEMA model and the node inertia.

The second calculating unit is configured to solve the OEMA model in the first calculating unit by adopting a multi-innovation identification to identify the unknown parameter of the OEMA model.

The analyzing unit is configured to calculate an inertia of each node using the unknown parameter of the OEMA model identified by the second calculating unit according to an analytical relationship between a vector of the unknown parameter and the node inertia to estimate an overall spatial distribution of the inertia of the power system.

In this embodiment, the first calculating unit is performed as follows.

In terms of a mechanism of a frequency response of the power system, a coupling relationship among the node inertia, the node frequency and the node injection power is analyzed.

Laplace transform is used to convert a time domain relationship among the node inertia, the node frequency, and the node injection power into a continuous frequency domain expression, in which the continuous frequency domain expression is a continuous transfer function including an information of the node inertia.

The OEMA model is constructed to describe the active power-frequency dynamic change process of each node. Solving of the node inertia is converted into identification of the unknown parameter of the OEMA model. And the coupling relationship between the unknown parameter of the OEMA model and the node inertia is analyzed. An expression of the OEMA model is shown as follows:

$$y(t) = \frac{B(z)}{A(z)}u(t) + D(z)v(t)$$

$$x(t) = \frac{B(z)}{A(z)}u(t);$$

where $A(z)=1+a_1z^{-1}+ \ldots +a_{n_a}z^{-n_a}$; $B(z)=b_1z^{-1}+ \ldots +b_{n_b}z^{-n_b}$; $D(z)=1+d_1z^{-1}+ \ldots +d_{n_d}z^{-n_d}$; $y(t)$ is an output sequence of the OEMA model to be identified; $u(t)$ is an input sequence of the OEMA model to be identified; $v(t)$ is a zero-mean Gaussian random white noise sequence; $x(t)$ is an internal variable, which represents an actual undetectable variable of the power system; $z^{-1}$ is a unit backshift operator, expressed as $z^{-1}y(t)=y(t-1)$; and $a_{n_a}$, $b_{n_b}$, $d_{n_d}$ and represent parameters to be identified of the OEMA model.

The estimation of the spatial distribution of the power system inertia based on multi-innovation identification is performed in accordance with the method in Embodiment 1, which will not be repeated herein.

Compared with the conventional devices for estimating the power system inertia, the device of this disclosure refines the estimation result of the spatial distribution of the inertia to the node level, which has a higher degree of refinement. This disclosure is capable of effectively overcoming the interference of a large number of random factors such as data measurement noise, allowing for a strong robustness of the model. The multi-innovation identification adopted in this disclosure is capable of effectively solving the model for estimating the spatial distribution of the inertia. In this disclosure, the model is of desirable adaptability to disturbance faults. The model is capable of accurately estimating the spatial distribution of the inertia of the power system under disturbances varying in location and intensity).

The above embodiments are only used to illustrate the objectives, technical solutions, and beneficial effects of this disclosure, and are not intended to limit the present disclo-

What is claimed is:

1. A method for estimating an inertia distribution of a power system, the method comprising:
   (S1) acquiring time-series data which comprises a frequency at each of a plurality of nodes of the power system, and a transmission power of a transmission line, and preprocessing the time-series data; decomposing the frequency in a series of different frequency domains to identify a moment when a disturbance occurs and trace an impact of the disturbance fast;
   (S2) constructing an output error moving average (OEMA) model to describe an active power-frequency dynamic process for each of the nodes of the power system after the disturbance, and analyzing a coupling relationship between an unknown parameter in the OEMA model and an inertia at each of the nodes of the power system;
   (S3) solving the OEMA model by adopting a multi-innovation identification, and identifying the unknown parameter of the OEMA model; and
   (S4) calculating the inertia at each of the nodes of the power system by using the unknown parameter of the OEMA model identified in step (S3) according to an analytical relationship between a vector of the unknown parameter and the inertia at each of the nodes of the power system, to estimate the inertia distribution of the power system;
   wherein the step (S1) comprises:
   (S11) receiving, from a plurality of phasor measurement units (PMUs), the time-series data;
   (S12) preprocessing the time-series data obtained in step (S11) through interpolation of missing data and elimination of a data measurement noise via-filtering;
   wherein the step (S2) comprises:
   (S21) in terms of a mechanism of a frequency response of the power system, analyzing a coupling relationship among the inertia at each of the nodes of the power system, the frequency at each of the nodes of the power system and an injection power at each of the nodes of the power system;
   (S22) using Laplace transform to convert a time domain relationship among the inertia, the frequency and the injection power at each of the nodes of the power system into a continuous frequency domain expression that is a continuous transfer function; and
   (S23) constructing the OEMA model to describe the active power-frequency dynamic change process for an identification of the unknown parameter of the OEMA model; and analyzing the coupling relationship between the unknown parameter of the OEMA model and the inertia at each of the nodes of the power system;
   wherein an expression of the OEMA model is shown as follows:

$$y(t) = \frac{B(z)}{A(z)}u(t) + D(z)v(t)$$

$$x(t) = \frac{B(z)}{A(z)}u(t);$$

wherein, $A(z)=1+a_1z^{-1}+\ldots+a_{n_a}z^{-n_a}$, $B(z)=b_1z^{-1}+\ldots+b_{n_b}z^{-n_b}$, $D(z)=1+d_1z^{-1}+\ldots+d_{n_d}z^{-n_d}$; $y(t)$ is an output sequence; $u(t)$ is an input sequence; $v(t)$ is a zero-mean Gaussian random white noise sequence, $x(t)$ is an internal variable, which represents an actual undetectable variable of the power system; $z^{-1}$ is a unit backshift operator expressed as $z^{-1}y(t)=y(t-1)$; and $a_{n_a}$, $b_{n_b}$, $d_{n_d}$ represents parameters to be identified;

wherein the step (S3) comprises:
   (S31) expanding a single innovation describing the active power-frequency dynamic change process into multiple innovations to establish a multi-innovation matrix; wherein the multi-innovation matrix is expressed as follows:

$$\begin{bmatrix} X(p,t) \\ Y(p,t) \\ V(p,t) \\ \psi(p,t) \end{bmatrix} = \begin{bmatrix} x(t), x(t-1), \ldots, x(t-p+1) \\ y(t), y(t-1), \ldots, y(t-p+1) \\ v(t), v(t-1), \ldots, v(t-p+1) \\ \varphi(t), \varphi(t-1), \ldots, \varphi(t-p+1) \end{bmatrix};$$

wherein $\varphi(t)$ is an information vector comprising the internal variable $x(t)$, and $\varphi(t)=[-x(t-1), \ldots, -x(t-n_a), u(t-1), \ldots, u(t-n_b), v(t-1), \ldots, v(t-n_d)]^T$; $X(p,t)$ is an accumulated internal variable; $Y(p,t)$ is an accumulated output vector; $V(p,t)$ is an accumulated noise variable; $\psi(p,t)$ is an accumulated information matrix; and $p$ is the number of an innovation vector;
   (S32) replacing the internal undetectable variable of the OEMA model with an output of an auxiliary model;
   (S33) based on step (S32), setting a criterion function, obtaining an optimal identification result of a parameter of the OEMA model on a basis of a least squares estimation principle on the premise of allowing the criterion function to be minimum to obtain values of all unknown parameters of the OEMA model;

wherein the step (S4) comprises:
   (S41) establishing a mapping relationship between a z-plane and an s-plane based on bilinear transformation; and according to the vector of the parameter of the OEMA model identified in step (S3), obtaining an undetermined parameter of a continuous transfer function corresponding to the OEMA model;
   (S42) performing an inverse Laplace transform on the transfer function obtained in step (S41) to obtain an impulse response of a corresponding control system; taking an initial response value to obtain a reciprocal of twice the inertia at each of the nodes of the power system, thereby estimating a value of the inertia at each of the nodes of the power system;
   (S43) visually displaying the inertia distribution of the power system by combining geographic information of each of the nodes, based on the value of the inertia at each of the nodes of the power system, and locating a node that has lower inertia than other nodes of the power system.

2. The method of claim 1, wherein the step (S1) comprises:
   (S13) normalizing the time-series data preprocessed in step (S12) to form a dataset in a standard form;
   (S14) decomposing the frequency at each of the nodes of the power system in the series of different frequency domains based on wavelet multi-resolution analysis using a Daubechies Wavelet; and extracting a wavelet detail coefficient at each level to determine a modulus maxima spot, thereby detecting a singular point of the frequency at each of the nodes of the power system that is an initial time when the disturbance occurs.

3. The method of claim 1, wherein in step (S21), the coupling relationship among the node inertia, the node frequency and the node injection power is expressed as follows:

$$2H_i \frac{d\Delta f_i(t)}{dt} = \Delta P_i(t);$$

which is further converted into:

$$H_i = \frac{\Delta P_i(t)}{2\frac{d\Delta f_i(t)}{dt}};$$

wherein $H_i$ is the value of the inertia at a node i, and represents a magnitude of a hindering effect of the inertia on the frequency at the node i during a $\Delta P_i$–$d\Delta fi/dt$ process; $\Delta f_i$ is a frequency deviation; $\Delta P_i$ is an increment of the injection power;

in step (S22), the continuous transfer function corresponding to the relationship among the inertia at each of the nodes of the power system, the frequency at each of the nodes of the power system and the injection power at each of the nodes of the power system is expressed as follows:

$$G(s) = \frac{\Delta f_i(s)}{\Delta P_i(s)} = \frac{1}{2H_i s};$$

wherein $\Delta f_i(s)$ is a frequency domain expression of the frequency deviation; $\Delta P_i(s)$ is a frequency domain expression of the increment of the injection power at each of the nodes of the power system; and s is a Laplace operator.

4. The method of claim 1, wherein in step (S41), the bilinear transform is configured to realize a mapping from the z-plane to the s-plane, and is expressed as follows:

$$z = \frac{e^{sT/2}}{e^{-sT/2}} \approx \frac{1 + sT/2}{1 - sT/2};$$

wherein z is a sampling Laplace operator; s is the Laplace operator; and T is a sampling period.

5. The method of claim 1, wherein the frequency at each of the nodes of the power system is decomposed and reconstructed under the Daubechies Wavelet basis to detect the singular point of the frequency to identify an initial moment upon a response of the inertia at each of the nodes of the power system, wherein an expression of the wavelet multi-resolution analysis is shown as follows:

$$W_f(a, b) = <f, \psi_{a,b}> = |a|^{-1/2} \int_{-\infty}^{+\infty} f(t)\psi\left(\frac{t-b}{a}\right)dt;$$

wherein $\psi a, b(t)$ is a mother wavelet function, which is the Daubechies Wavelet basis; a is a scale coefficient; b is a translating coefficient, and f(t) is an acquired frequency.

* * * * *